(12) United States Patent
Alpert et al.

(10) Patent No.: US 8,677,305 B2
(45) Date of Patent: Mar. 18, 2014

(54) DESIGNING A ROBUST POWER EFFICIENT CLOCK DISTRIBUTION NETWORK

(75) Inventors: Charles Jay Alpert, Austin, TX (US);
Joseph Nicolas Kozhaya, Morrisville, NC (US); Zhuo Li, Cedar Park, TX (US); Joseph J Palumbo, Poughkeepsie, NY (US); Haifeng Qian, White Plains, NY (US); Phillip John Restle, Katonah, NY (US); Chin Ngai Sze, Austin, TX (US); Ying Zhou, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/488,065

(22) Filed: Jun. 4, 2012

(65) Prior Publication Data
US 2013/0326456 A1    Dec. 5, 2013

(51) Int. Cl.
*G06F 17/50* (2006.01)

(52) U.S. Cl.
USPC ............ 716/134; 716/108; 716/113; 716/114

(58) Field of Classification Search
USPC .................................. 716/108, 113–114, 134
See application file for complete search history.

(56) References Cited

U.S. PATENT DOCUMENTS

| | | | |
|---|---|---|---|
| 6,006,025 A * | 12/1999 | Cook et al. ..................... | 716/113 |
| 6,204,713 B1 * | 3/2001 | Adams et al. ................. | 327/295 |
| 6,205,571 B1 | 3/2001 | Camporese et al. | |
| 6,311,313 B1 | 10/2001 | Camporese et al. | |
| 6,351,840 B1 | 2/2002 | Teng | |
| 6,601,025 B1 | 7/2003 | Ditlow et al. | |
| 6,651,232 B1 | 11/2003 | Pileggi et al. | |
| 6,698,006 B1 | 2/2004 | Srinivasan et al. | |
| 6,769,104 B2 * | 7/2004 | Rodgers et al. ............... | 327/295 |
| 7,308,669 B2 | 12/2007 | Buehler et al. | |
| 7,404,169 B2 | 7/2008 | Lim et al. | |
| 7,549,137 B2 * | 6/2009 | Alpert et al. .................. | 716/114 |
| 7,571,410 B2 | 8/2009 | Restle | |
| 7,788,613 B2 | 8/2010 | Walker et al. | |
| 8,006,213 B2 | 8/2011 | Berry et al. | |
| 8,015,527 B2 | 9/2011 | Buehler et al. | |
| 2003/0135836 A1 * | 7/2003 | Chang et al. .................... | 716/11 |
| 2007/0288875 A1 | 12/2007 | Eakins et al. | |
| 2008/0059933 A1 | 3/2008 | Barke et al. | |
| 2008/0229266 A1 | 9/2008 | Bueti et al. | |
| 2009/0237134 A1 | 9/2009 | Hwang et al. | |
| 2010/0100347 A1 | 4/2010 | Buehler et al. | |

(Continued)

OTHER PUBLICATIONS

"U.S. Appl. No. 13/680,775 Final Office Action", Aug. 27, 2013, 10 Pages.

(Continued)

*Primary Examiner* — Nghia Doan
(74) *Attorney, Agent, or Firm* — DeLizio Gilliam, PLLC

(57) ABSTRACT

An electronic automation design tool with a sink locator unit creates clusters of loads from a plurality of loads within a sector of a clock network design based on balancing magnitudes of the loads among the clusters of loads and based on minimal delays of each of the clusters and respective ones of a plurality of sink locations in the sector of the clock network design. The tool determines centers of the clusters of loads, and sink locations corresponding to the centers of the clusters for connecting output terminal points of sector buffers are determined. Each of the sector buffers drive a clock signal to a corresponding one of the clusters of loads.

10 Claims, 4 Drawing Sheets

(56) References Cited

U.S. PATENT DOCUMENTS

| | | |
|---|---|---|
| 2012/0011485 A1 | 1/2012 | Suaya et al. |
| 2012/0047478 A1 | 2/2012 | Ge et al. |
| 2012/0221996 A1 | 8/2012 | Thayer |
| 2012/0240091 A1 | 9/2012 | Sunder et al. |

OTHER PUBLICATIONS

"U.S. Appl. No. 13/680,775 Office Action", Apr. 30, 2013, 16 pages.

Berridge, R et al., "IBM POWER6 microprocessor physical design and design methodology", IBM J. Res. & Dev. vol. 51 No. 6 Nov. 2007, pp. 685-714.

Ganguly, Shantanu et al., "Clock Distribution Methodology for PowerPC Microprocessors", Journal of VLSI Signal Processing 16, 181-189 (1997) Jun. 1, 1997, pp. 69-77.

Hu, Xuchu et al., "Distributed LC Resonant Clock Grid Synthesis", IEEE Transactions on Circuits and Systems—I: Regular Papers Nov. 2012, pp. 1-12.

Qian, Haifeng et al., "Power Grid Analysis Using Random Walks", IEEE Transactions on Computer-Aided Design of Integrated Circuits and Systems, vol. 24, No. 8 Aug. 2005, 21 pages.

Vishweshwara, R et al., "Placement Aware Clock Gate Cloning and Redistribution Methodology", 13th Int'l Symposium on Quality Electronic Design, IEEE Mar. 19-21, 2012, 5 pages.

Warnock, J D et al., "The circuit and physical design of the POWER4 microprocessor", IBM J. Res. & Dev. vol. 46 No. 1 Jan. 2002, pp. 27-51.

"U.S. Appl. No. 13/724,212 Office Action", Nov. 8, 2013, 13 pages.

\* cited by examiner

DESIGNING A ROBUST POWER EFFICIENT CLOCK DISTRIBUTION NETWORK

BACKGROUND

Embodiments of the inventive subject matter generally relate to the field of computers, and, more particularly, to designing a power efficient clock distribution network.

High-performance very large scale integration (VLSI) chips have an internal clock signal that is a function of an external clock signal. The internal clock signal (hereinafter "clock signal") is distributed to a large number of clock pins. The clock pins are specific locations or metal shapes on a VLSI chip (hereinafter "chip") which have a known or estimated effective pin capacitance. The frequency of the clock signal determines the frequency and cycle time of the chip. Shorter cycle times and higher chip frequencies are desirable for improving the chip performance. Clock skew is the difference in arrival time of the clock signal at different locations in the chip. Clock skew can limit achievable cycle time and reduce chip performance. Clock slew is the rate of change of the clock signal voltage.

Clock buffers (hereinafter "sector buffers") drive the clock signal in a sector (i.e., a section) of the clock distribution network. The sector buffers help in reducing clock skew and improve the chip performance. The output terminal point of a sector buffer may be connected at one or more of the multiple locations in the sector. The locations at which the output terminal points of the sector buffers are connected, are referred to as sink locations.

SUMMARY

Embodiments of the inventive subject matter include a method that determines, within a sector in a clock network design, a plurality of initial sink locations for connection of output terminal points of sector buffers. The sector comprises a plurality of loads. The plurality of loads are balanced across the plurality of initial sink locations based, at least in part, on magnitude of the loads and delays of paths between the loads and the plurality of initial sink locations. Balancing the plurality of loads across the plurality of initial sink locations yields clusters of loads from the plurality of loads. For each of the clusters of loads, a center sink location that is at least approximately at a center of the cluster of loads is determined. And a final sink location is indicated based on the center sink location. The final sink location is a connection for an output terminal point of a sector buffer that drives a clock signal to the loads of the cluster of loads.

Embodiments of the inventive subject matter include a method that creates clusters of loads from a plurality of loads within a sector of a clock network design based on balancing magnitudes of the loads among the clusters of loads and based on minimal delays of each of the clusters and respective ones of a plurality of sink locations in the sector of the clock network design. Centers of the clusters of loads are determined. Sink locations corresponding to the centers of the clusters for connecting output terminal points of sector buffers are determined. Each of the sector buffers drives a clock signal to a corresponding one of the clusters of loads.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

The description that follows includes exemplary systems, methods, techniques, instruction sequences and computer program products that embody techniques of the present inventive subject matter. However, it is understood that the described embodiments may be practiced without these specific details. For instance, examples refer to a sink locator unit determining sink locations to connect output terminals of sector buffers in a clock design network. However, embodiments are not limited to the sink locator unit determining the sink locations to connect output terminals of sector buffers in the clock design network. The sink locations may be determined by other units embodied in a circuit design tool or the system memory. In other instances, well-known instruction instances, protocols, structures and techniques have not been shown in detail in order not to obfuscate the description.

A sink locator unit allows designing a power efficient clock distribution network by reducing clock skew and a difference between the minimum and maximum slew rate for clock signals. The sector buffers driving the clock signals typically have a high fan-out. In addition, a clock distribution network commonly has unevenly distributed loads (e.g., capacitive loads representing the input capacitances of the circuits receiving the clock signal) in contrast to an assumption of evenly distributed loads by conventional tools. In addition, a number of loads are often locally wired together by a clock grid, or one or more clock spines, or other local wiring structures. These local wiring structures are connected to the output terminal points of sector buffers at certain sink locations chosen to reduce the clock skew and improve the clock slew. Also, when sink locations for a sector buffer are chosen such that delays on the paths to the loads to be driven are balanced, the chip performance can be further improved.

Figure 1:
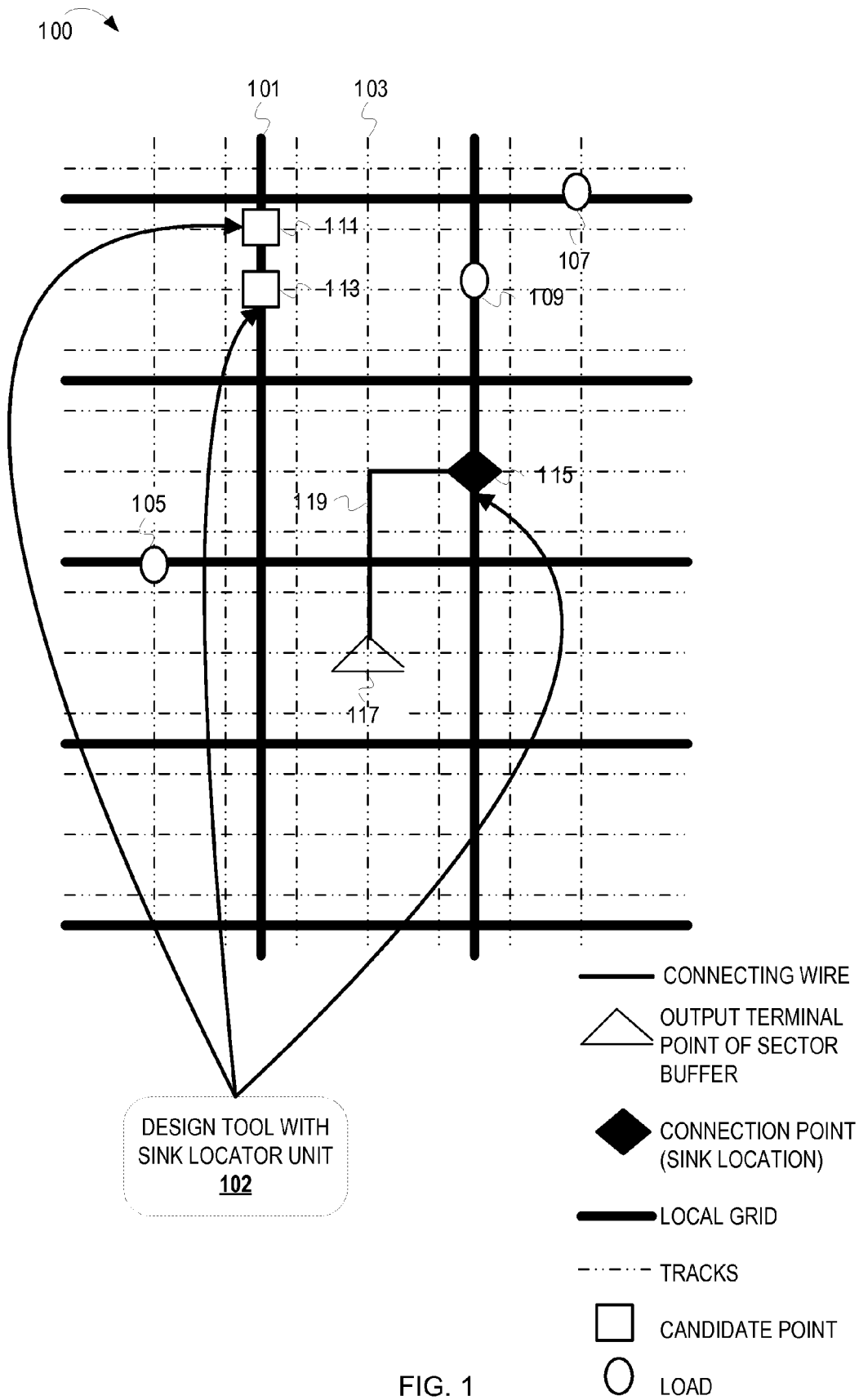
FIG. 1 depicts an example conceptual diagram of a design tool with a sink locator unit determining a connection point for one or more output terminal points of a sector buffer in a sector.

FIG. 1 depicts an example conceptual diagram of a design tool with a sink locator unit determining a connection point for one terminal point of a sector buffer in a sector. FIG. 1 depicts a sector 100 and a design tool 102 with a sink locator unit. The sector 100 is one of multiple sectors in a clock distribution network. The clock distribution network is efficiently tuned from a geographic perspective of the clock distribution network as represented by the sectors. A design tool tunes a clock distribution network to achieve desired clock skew and clock slew. Sector buffers drive clock signals in a sector to the loads in the sector. The sector buffers may not be located close to the sector, however the output terminal points of the sector buffers are connected to sink locations in the sector to drive the clock signals. The sector 100 includes a local grid 101 (represented by the thickest gridlines) and available tracks 103 (represented by the dashed gridlines). The local grid could alternatively consist of vertical or horizontal clock spines, or any other wiring structure or structures that collectively connect loads in the sector 100. The clock signals are transmitted over the local grid 101. Signals driven to a chip are transmitted using the tracks 103. The local grid 101 includes loads 105, 107 and 109. The loads on the local grid 101 are typically capacitive loads due to high fan-out of logic gates driving the clock signals. Candidate points 111 and 113 are the locations in the sector 100 which lie at the intersection of the local grid 101 and the tracks 103. The candidate points 111 and 113 represent the locations where an output terminal point 117 of a sector buffer in the sector 100 can be connected. For simplification, all candidate points are not depicted in the sector 100. The sector 100 also includes a point 115 that starts as a candidate point and is eventually chosen as a connection point. The connection point 115 is connected to the output terminal point 117 of the sector buffer via a connecting wire 119. The connection point 115 is also referred to as the sink location for the sector buffer.

The design tool 102 selects the candidate point 115 to be the connection point 115 for connecting the output terminal point 117 of the sector buffer. For simplification, FIG. 1 only depicts a single sink location. However, the design tool 102 can determine one or more sink locations for each of the sector buffers in the sector 100. In certain existing techniques, the sink locations for the sector buffers are determined as the geometrically symmetric points in a sector, based on an assumption of symmetric distribution of loads in the sector. However, the loads are typically not uniformly distributed. A clock distribution network design with an assumption that the loads are uniformly distributed results in higher clock skew and large variations in clock slew. Also, clock slew impacts the power of clock signal to be utilized. A reduction in the difference between the maximum and minimum clock slew allows a designer to increase the mean clock slew which reduces the power of the clock signal to be utilized. For example, a reduction by 1 picosecond in difference between the maximum and minimum clock slew may allow an increase in mean clock slew by 0.5 picosecond. The increase in mean clock slew by 0.5 picosecond can result in reduction of the clock signal power requirements by approximately 1.5%. The design tool 102 with sink locator unit balances the magnitude of loads to be driven via each sink location. At first, the design tool 102 determines the sets of loads to be driven within the sector. The set of loads to be driven primarily by a single sink location is referred to as a cluster. The design tool 102 then determines the sink locations in the sector 100 from candidate points in the clusters. The design tool 102 determines the candidate point having the least delay on paths to all the loads to be driven by the sink location. The delay on the path to a load is estimated using a RC wire delay calculation, or other wire delay estimation techniques. For example, using the commonly used Elmore delay approximation, the delay of a wire segment to a load is the product of the resistance (including resistance of the wire connecting the load) and the total capacitance driven by the wire segment. In some embodiments, the design tool 102 can utilize other techniques (e.g., static timing analysis) to estimate the delay on the path to the load.

With reference to FIG. 1, the design tool 102 determines the set of loads 105, 107 and 109 to be driven by a single sink location as a cluster. The candidate points in the cluster are 111, 113 and 115. In one example, the design tool 102 calculates Elmore delay on paths to the loads 105, 107 and 109 from each of the candidate points 111, 113 and 115. The design tool 102 determines that the candidate point 115 minimizes the maximum Elmore delay to the loads. The design tool 102 determines the candidate point 115 as the sink location.

Although FIG. 1 depicts a single sink location for each sector buffer, the number of sink locations may be greater or less than the number of sector buffers. For example, the design tool 102 may determine to drive 5 sink locations in a sector with only 4 sector buffers. The design tool 102 can drive 2 sink locations with one of the sector buffers, and 1 sink location with each of the other 3 sector buffers. Conversely, if the number of sink locations is less than the number of sector buffers that have already been placed, then one or more of them may be deleted, or the outputs of two sector buffers can be shorted together to drive a single sink location.

Figure 2:
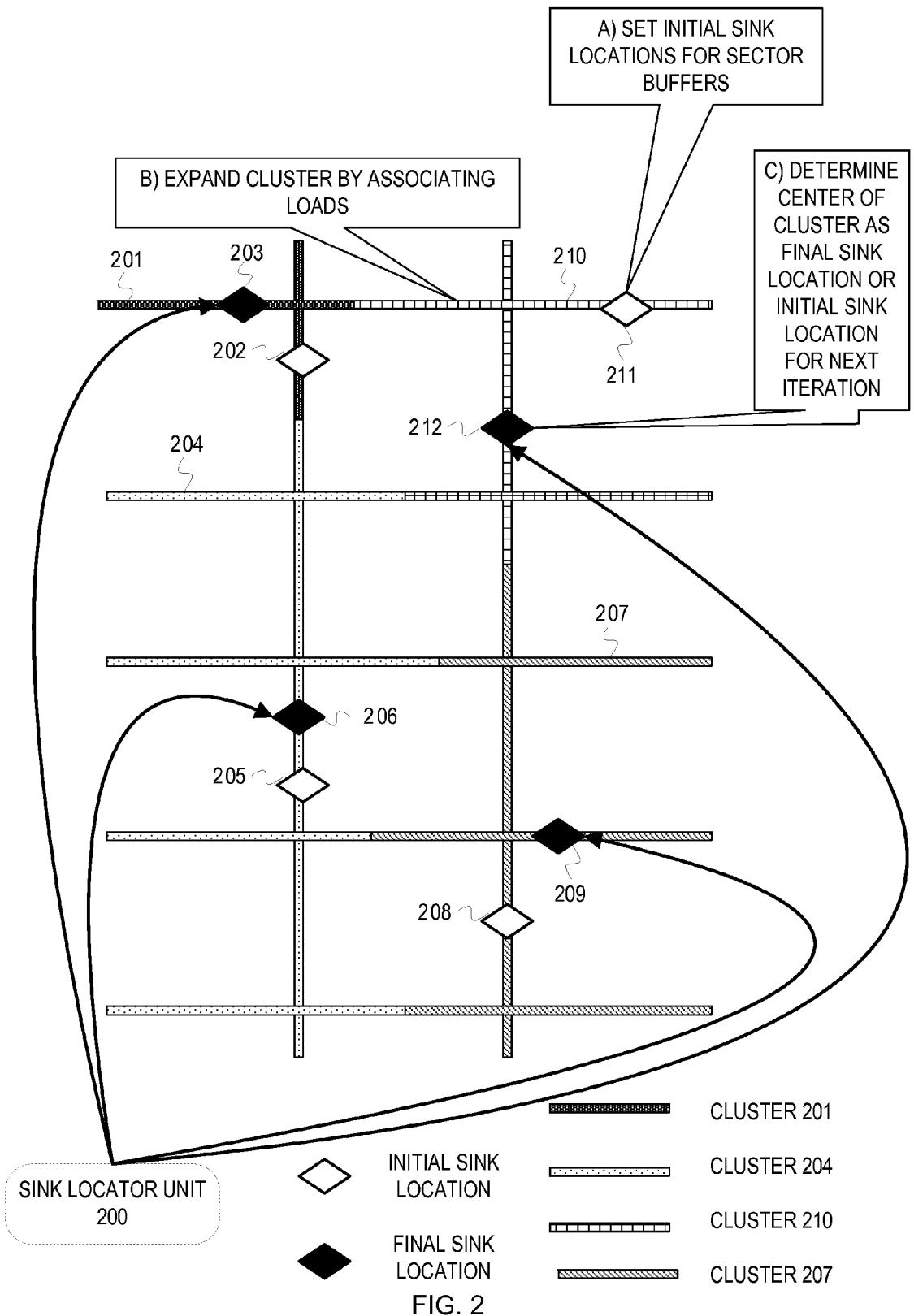
FIG. 2 depicts an example conceptual diagram of a sink locator unit determining initial sink locations, clusters and final sink locations for sector buffers in a sector of a clock distribution network.

FIG. 2 depicts an example conceptual diagram of a sink locator unit, growing clusters to determine final sink locations for sector buffers in a sector of a clock distribution network. FIG. 2 illustrates an example of a sector having four sector buffers to drive the total load for the sector. FIG. 2 includes a sink locator unit 200. FIG. 2 also includes clusters 201, 204, 207 and 210. The cluster 201 includes an initial sink location 202 and a final sink location 203. The cluster 204 includes an initial sink location 205 and a final sink location 206. The cluster 207 includes an initial sink location 208 and a final sink location 209. The cluster 210 includes an initial sink location 211 and a final sink location 212. The sink locator unit 200 sets initial sink locations for sector buffers, determines clusters corresponding to the initial sink locations and determines final sink locations for the clusters. FIG. 2 depicts operations performed by the sink locator unit 200 in a sequence of stages A-C.

At stage A, the sink locator unit 200 sets initial sink locations 202, 205, 208 and 211 for sector buffers. The sink locator unit 200 has the information about the number of sector buffers to be utilized for a sector. The sink locator unit 200 can also determine the number of sink locations to be utilized for the sector. For example, the sink locator unit 200 determines the number of sink locations using the information about the magnitude of load to be driven in the sector and the load driving capacity of the sector buffers. The sink locator unit 200 can set the initial sink locations 202, 205, 208 and 211 at geometrically symmetric locations in the sector. The sink locator unit 200 can also set the initial sink locations at certain pre-determined locations. A set of initial locations is referred to as a random seed, but some embodiments can employ seeds chosen deterministically if desired. If instead of a single local grid within the sector, there are multiple spines or other wiring structures connecting the loads, then there is at least one seed location on each separate spine, such that all loads are driven by the sector buffers and chosen sink locations.

At stage B, the sink locator unit 200 expands clusters by associating loads to the clusters. The sink locator unit 200 associates loads in a local grid with the clusters corresponding to the initial sink locations 202, 205, 208 and 211. The sink locator unit 200 expands the clusters while balancing the loads across the clusters. For example, the sink locator unit 200 associates a load of magnitude 5 pF (pico-Farad) with the cluster corresponding to the initial sink location 202. The sink locator unit 200 then associates five loads of 1 pF to the cluster corresponding to the initial sink location 211. The sink locator unit 200 associates loads with the clusters in parallel, and hence ensures that the magnitude of loads associated with each cluster are balanced. The sink locator unit 200 also associates a load with a cluster based on the delay on the path to the load from the initial sink location of the respective cluster. For example, when one of the multiple loads can be associated with a cluster, the sink locator unit 200 determines the load with the least delay on the path to the load from the initial sink location. When all loads of a sector in the local grid of that sector are associated with the clusters, the sink locator unit 200 determines the boundaries of the clusters.

At stage C, the sink locator unit 200 determines the center of the clusters 201, 204, 207, 210 as the final sink locations 203, 206, 209 and 212 respectively. The sink locator unit 200 determines the center of clusters based on the delay on paths from the loads to certain candidate points in the cluster. The sink locator unit 200 can determine the candidate points based on symmetry of the cluster or as random points in the cluster. The sink locator unit 200 determines the candidate point having the least delay on paths from the loads as the center of the cluster. The sink locator unit 200 can determine centers of multiple clusters in parallel or taking one cluster at a time. The location of the center of a cluster is not affected by the locations of centers of other clusters. In some embodiments, when the sink locator unit 200 performs multiple iterations to determine final sink locations, the sink locator unit 200 may determine the center of the clusters as initial sink locations for the next iteration.

Figure 3:
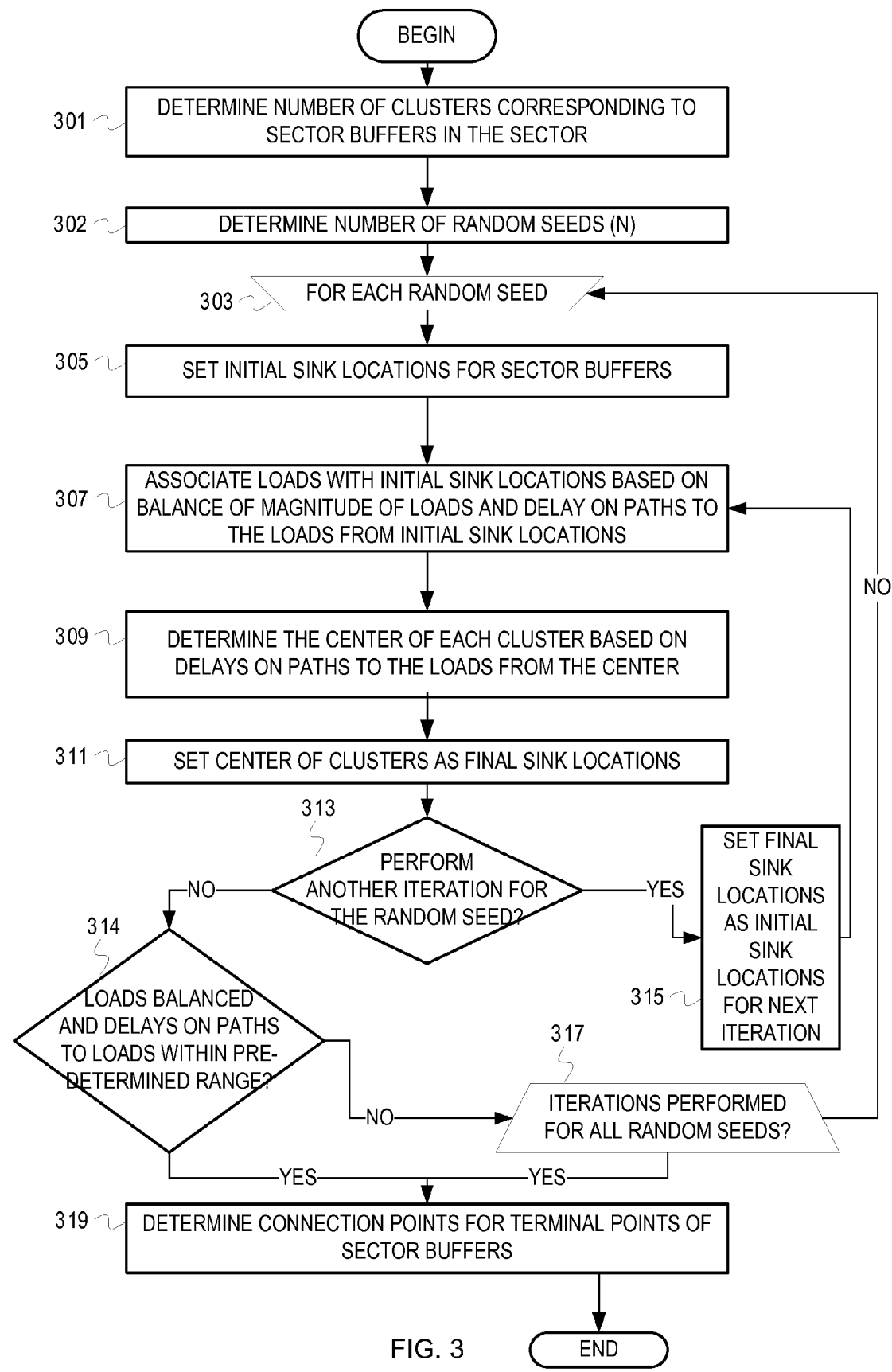
FIG. 3 illustrates a flow diagram of example operations to determine sink locations for sector buffers in a sector.

FIG. 3 illustrates a flow diagram of example operations to determine sink locations for sector buffers in a sector. The operations in flow diagram of FIG. 3 can include one or more iterations of the operations depicted above with reference to FIG. 2. The operations of FIG. 3 can be run for each sector within a clock distribution network.

At block 301, the number of clusters corresponding to the sector buffers utilized in the sector is determined. The number of clusters is the same as the number of sink locations which may be greater than or smaller than the number of sector buffers in the sector. In other words, the number of clusters/sink locations to drive total load for the sector is determined.

At block 302, the number of random seeds (N) is determined. A random seed is a set of initial sink locations. For example, the sink locator unit 200 utilizes a random seed to perform a single iteration of the operations described in FIG. 2. The number of random seeds may be determined based on target clock skew and clock slew to be achieved for clock signals in the sector. Embodiments do not necessarily utilize all random seeds. For example, once the final sink locations for sector buffers which fulfill the target clock skew and clock slew constraints is determined using certain random seeds, the remaining random seeds are not utilized.

At block 303, a loop is started for each random seed. The loop includes operations at blocks 305, 307, 309, 311, 313, 314, 315 and 317.

At block 305, initial sink locations are set for sector buffers. The initial sink locations correspond to the random seed in the iteration of the loop at block 303.

At block 307, loads are associated with the initial sink locations based on balancing of magnitude of loads and delay on paths to the loads from the initial sink locations. Each of the loads is associated with one of the initial sink locations based on minimal delay and balanced association of loads across the initial sink locations. The first associations of loads with initial sink locations create the clusters, and the subsequent associations grow the clusters. For example, a design tool selects an initial sink location A, and selects a load alpha based on determining a minimal delay between the initial sink location A and the load alpha among all of the other loads. So, the tool associates the load alpha with the initial sink location A. For this example, the load alpha has a load of 5 pico-Farads. The tool then selects an initial sink location B. The tool determines that the delay between the initial sink location B and a load beta has the least delay between the initial sink location B and the remaining unassociated loads The tool associates the load beta, which has a load of 1 pico-Farad, with the initial sink location B. The tool then compares the loads associated with the initial sink locations A and B, and determines that the loads are not balanced. The tool then associates additional loads with the initial sink location B until it is balanced with the initial sink location A. In other words, the second cluster is balanced with the first cluster before moving on to creating the third cluster. Embodiments can progress through the initial associations with different techniques. For example, the tool can, instead, postpone associating loads based on balanced load magnitudes until at least one load is associated with each of the initial sink locations. Embodiments can set a threshold for balancing load magnitudes. For example, an embodiment can consider loads of clusters balanced as long as the difference is less than 2 pico-Farads. Embodiments can also utilize thresholds for delays. For example, a tool can associate a load with an initial sink location having a greater delay than a load with minimal delay if the delay is only greater by 0.1 picosecond and the load is different by no more than 0.5 pico-Farads. Embodiments maintain "frontiers" of the clusters. Maintaining frontiers, involves tracking the outermost loads of the clusters. Thus, selection of the next loads to consider for associating with a cluster begins with those unassociated loads located near these outermost loads (i.e., located outside of the border of the cluster). A design tool can leverage the physical information from the design to determine location information of the loads. Embodiments can employ a variety of data structures to represent the clusters and track growth of clusters (e.g., vectors, sets, graph structures, etc.).

It is noted that in some examples the clusters may be shorted together, and hence the delay calculations are in fact approximations. Each cluster can be analyzed separately, though it may or may not be shorted with another cluster by a local grid, spines, etc. Each sink location corresponds to one cluster. However, one sector buffers can drive more than one sink locations. The creation of clusters calculates the total capacitance associated with a sink location/cluster.

At block 309, a center of each cluster is determined based on delays on paths to the loads from the center. A tool evaluates candidate sink locations encompassed within a cluster to find a candidate sink location with the smallest value of the sum of delays with respect to all loads of the cluster. A tool can be configured to iterate through all candidate sink locations to find the least value of the sum of delays; can be configured to iterate through a given number of candidate sink locations to find the smallest value of the sum of delays among the given number of candidate sink locations; can be configured to evaluate candidate sink locations until a target delay is satisfied; etc.

At block 311, the center of clusters determined at block 309 are set as the final sink locations.

At block 313, it is determined whether to perform another iteration for the random seed. In some embodiments, the final sink locations are evaluated to determine whether they satisfy certain conditions for determining whether to perform another iteration for the random seed. For example, the sink locator unit 200 determines whether the difference between the loads in each of the clusters is within a certain range (e.g., a variation of 2%). In some embodiments, proceeding to another iteration for the random seed involves determining whether the delay on paths to the loads from the final sink locations is greater than a certain value (e.g., 10 pico-seconds). If another iteration for the random seed is to be performed, control flows to block 315. If another iteration for the random seed is not to be performed, control flows to block 314.

At block 315, the final sink locations (i.e., the final sink locations set at block 311) are set as initial sink locations for a next iteration of operations at blocks 307, 309 and 311 for the random seed.

At block 314, it is determined whether the loads are balanced and the delays on the paths to the loads are within a pre-determined range. For example, the sink locator unit 200 verifies that the loads are distributed in a balanced manner amongst the clusters to satisfy a target range of clock skew and clock slew. The sink locator unit 200 may also verify whether delays on paths to loads from the final sink locations (i.e., the final sink locations set at block 311) are less than a certain value (e.g., 10 micro-seconds). In some embodiments, the final sink locations are saved for the random seed. If the loads are balanced and the delays on the paths to the loads are within the pre-determined range, control flows to block 319. If the loads are not balanced or the delays on the paths to the loads are not within a pre-determined range, control flows to block 317.

At block 317, it is determined whether iterations have been performed for all random seeds. If the iterations have not been performed for all random seeds, control flows to block 303. If the iterations have been performed for all random seeds, control flows to block 319.

At block 319, connection points for the terminal points of the sector buffers in the sector are determined. Embodiments can utilize one or more previously stored final sink locations to determine the connection points (sink locations) for the terminal points of the sector buffers. For example, when multiple final sink locations are stored for multiple random seeds, the connection point is determined as the geometric center of the final sink locations.

Those of ordinary skill in the art should understand that the depicted flowchart includes examples to aid in understanding the inventive subject matter, and should not be used to limit the scope of the claims. The flow diagram in FIG. 3 illustrates determining sink locations for sector buffers in a single sector. However, embodiments can determine sink locations for sector buffers in multiple sectors in parallel. Embodiments can perform additional operations not depicted, fewer than the depicted operations, the operations in a different order, the operations in parallel, etc. Although not illustrated in the flow diagram, embodiments can also connect the terminal points of sector buffers in a sector with the sink locations of the respective sector buffers.

As will be appreciated by one skilled in the art, aspects of the present inventive subject matter may be embodied as a system, method or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present inventive subject matter may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present inventive subject matter are described with reference to flowchart illustrations and/or block diagrams of methods, apparatus (systems) and computer program products according to embodiments of the inventive subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
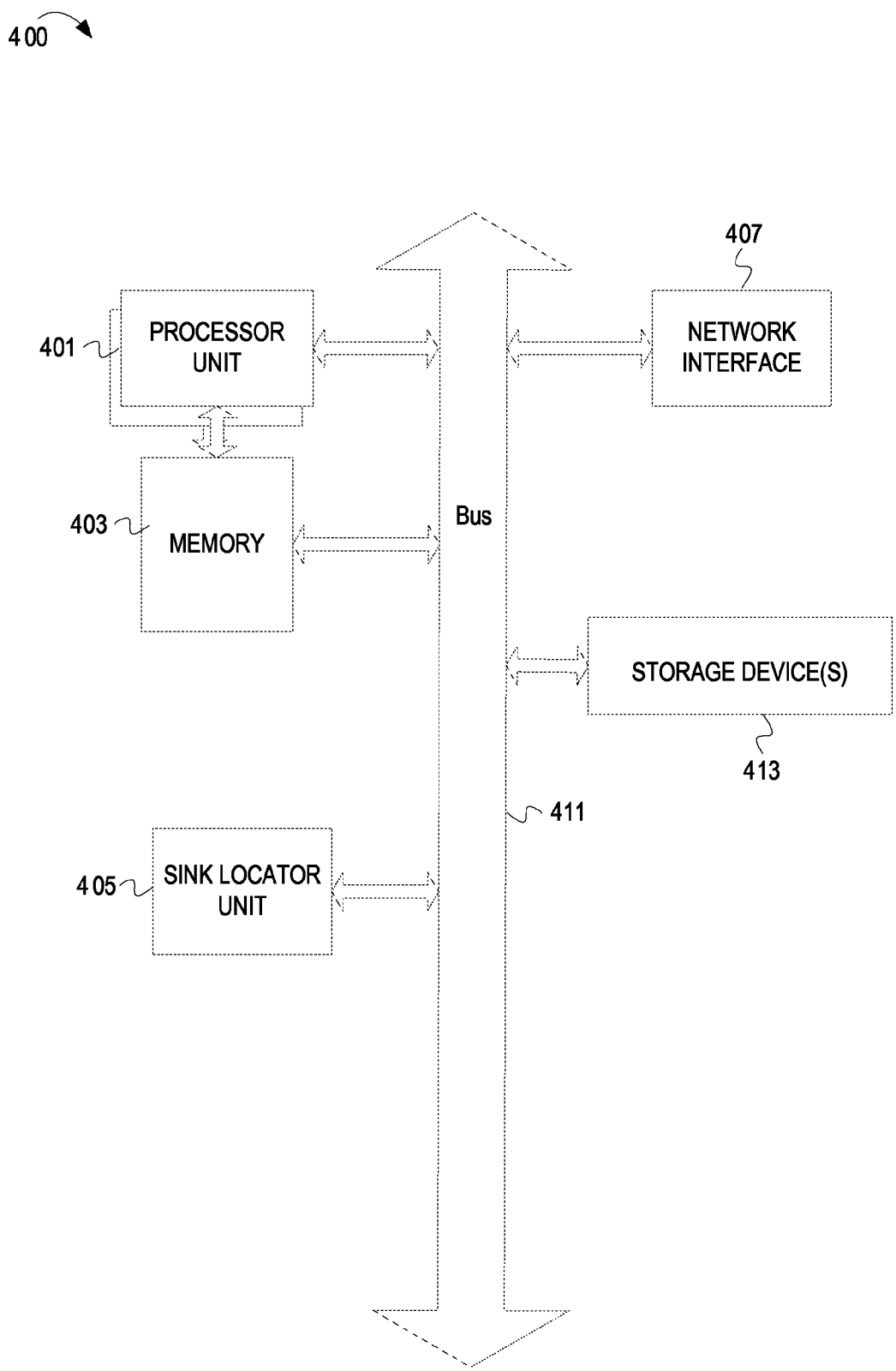
FIG. 4 depicts an example computer system with a sink locator unit.

FIG. 4 depicts an example computer system with a sink locator unit. FIG. 4 depicts a computer system 400. The computer system 400 includes a processor unit 401 (possibly including multiple processors, multiple cores, multiple nodes, and/or implementing multi-threading, etc.). The computer system includes memory 403. The memory 403 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 411 (e.g., PCI, ISA, PCI-Express, HyperTransport®, InfiniBand®, NuBus, etc.), a network interface 407 (e.g., an ATM interface, an Ethernet interface, a Frame Relay interface, SONET interface, wireless interface, etc.), a storage device(s) 413 (e.g., optical storage, magnetic storage, etc.) and a sink locator unit 405. The sink locator unit 405 embodies functionality to determine sink locations for sector buffers in a sector of a clock distribution network. The sink locator unit 405 selects initial sink locations in a sector. The sink locator unit 405 may select the initial sink locations based on geometrical symmetry in the sector. The sink locator unit 405 then creates a cluster for each of the initial sink locations. A cluster is a group of loads (e.g., capacitive loads) corresponding to a sink location (and hence corresponding to a sector buffer which drives a clock signal to the loads in the cluster). The sink locator unit 405 associates loads in the sector with the clusters and expands the clusters. The sink locator unit 405 determines to associate a load with a cluster by calculating the loads associated with remaining clusters in the sector. The sink locator unit 405 associates the loads with the clusters such that the loads are distributed in a balanced manner amongst the clusters. For example, the sink locator unit 405 associates a load having higher capacitance with one cluster, and associates multiple loads having smaller capacitances with other clusters. The sink locator unit 405 also associates a load with a cluster based on the delay on the path to the load from the initial sink location of the respective cluster. The sink locator unit 405 associates the load with one of the clusters such that the delay on the path to the load from the initial sink location of the respective cluster is minimized. When all loads in the design grid are associated with the clusters, the sink locator unit 405 determines the final sink locations as the center of each of the clusters. The sink locator unit 405 determines the center of cluster based on the delay on the paths to the loads in the cluster. The sink locator unit 405 can perform multiple iterations to fine tune the clusters and the centers of the clusters. The sink locator unit 405 then determines the final sink locations to connect the terminal points of the sector buffers. The sink locator unit 405 can utilize multiple initial sink locations and perform iterations to determine multiple final sink locations corresponding to the multiple initial sink locations. The sink locator unit 405 can then determine the sink locations for the sector buffers using multiple final sink locations. Any one of these functionalities may be partially (or entirely) implemented in hardware and/or on the processing unit 401. For example, the functionality may be implemented with an application specific integrated circuit, in logic implemented in the processing unit 401, in a co-processor on a peripheral device or card, etc. The sink locator unit 405 may be an independent unit as depicted or a component of a circuit design program. The sink locator unit 405 may be program code embodied in the memory 403.

Further, realizations may include fewer or additional components not illustrated in FIG. 4 (e.g., video cards, audio cards, additional network interfaces, peripheral devices, etc.). The processor unit 401, the storage device(s) 413, the network interface 407 and the sink locator unit 405 are coupled to the bus 411. Although illustrated as being coupled to the bus 411, the memory 403 may be coupled to the processor unit 401.

While the embodiments are described with reference to various implementations and exploitations, it will be understood that these embodiments are illustrative and that the scope of the inventive subject matter is not limited to them. In general, techniques for determining sink locations for sector buffers in a sector of a clock distribution network described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method comprising:
   determining, within a sector in a clock network design, a plurality of initial sink locations for connection of output terminal points of sector buffers, wherein the sector comprises a plurality of loads;
   balancing, by a computer, the plurality of loads across the plurality of initial sink locations based, at least in part, on magnitude of the loads and delays of paths between the loads and the plurality of initial sink locations, wherein said balancing the plurality of loads across the plurality of initial sink locations yields clusters of loads from the plurality of loads;
   wherein said balancing the plurality of loads across the plurality of initial sink locations based, at least in part, on magnitude of the loads and delays of paths between the loads and the plurality of initial sink locations comprises:
   for each of the initial sink locations,
   selecting an unassociated load of the plurality of loads based on a magnitude of the unassociated load of the plurality of loads and a sum of magnitudes of associated loads of the plurality of loads for each of the other sink locations, and based on delays of paths from unassociated loads of the plurality of loads to the initial sink location, wherein the unassociated load of the plurality of loads are loads not associated with the plurality of initial sink locations and the associated loads of the plurality of loads are associated with the other sink locations of the plurality of sink locations; and
   for each of the clusters of loads,
   determining a center sink location that is at least approximately at a center of the cluster of loads; and
   indicating a final sink location based on the center sink location, wherein the final sink location is a connection for an output terminal point of a sector buffer that drives a clock signal to the loads of the cluster of loads.

2. The method of claim 1 further comprising:
using the center sink locations of each of the clusters of loads as initial sink locations;
balancing the plurality of loads across the center sink locations based, at least in part, on magnitude of the loads and delays of paths between the loads and the center sink locations, wherein said balancing the plurality of loads across the center sink locations yields second clusters of loads from the plurality of loads;
for each cluster of the second clusters of loads,
determining a second center sink location that is at least approximately at a center of the cluster of the second cluster of loads;
wherein said indicating the final sink location based on the center sink location comprises selecting the second center sink location as the final sink location for the cluster of the second clusters of loads.

3. The method of claim 1, wherein said determining the center sink location that is at least approximately at the center of the cluster of loads for each of the clusters of loads comprises selecting the center sink location from a plurality of candidate sink locations within the cluster of loads.

4. The method of claim 3, wherein said selecting the center sink location from a plurality of candidate sink locations within the cluster of loads comprises determining a minimum of one of a summation, maximum, or standard deviation of delays on the paths to the loads from each of the plurality of candidate sink locations.

5. The method of claim 1, wherein said determining the center sink location that is at least approximately at the center of the cluster of loads for each of the clusters of loads comprises determining a geometric center of the cluster.

6. A computer program product for clock network design, the computer program product comprising:
a non-transitory computer readable storage medium having computer usable program code embodied therewith, the computer usable program code comprising a computer usable program code configured to:
determine, within a sector in a clock network design, a plurality of initial sink locations for connection of output terminal points of sector buffers, wherein the sector comprises a plurality of loads;
balance the plurality of loads across the plurality of initial sink locations based, at least in part, on magnitude of the loads and delays of paths between the loads and the plurality of initial sink locations, wherein the computer usable program code configured to balance the plurality of loads across the plurality of initial sink locations yields clusters of loads from the plurality of loads;
wherein said balancing the plurality of loads across the plurality of initial sink locations based, at least in part, on magnitude of the loads and delays of paths between the loads and the plurality of initial sink locations comprises:
for each of the initial sink locations,
selecting an unassociated load of the plurality of loads based on a magnitude of the unassociated load of the plurality of loads and a sum of magnitudes of associated loads of the plurality of loads for each of the other sink locations, and based on delays of paths from unassociated loads of the plurality of loads to the initial sink location, wherein the unassociated load of the plurality of loads are loads not associated with the plurality of initial sink locations and the associated loads of the plurality of loads are associated with the other sink locations of the plurality of sink locations; and
for each of the clusters of loads,
determine a center sink location that is at least approximately at a center of the cluster of loads; and
indicate a final sink location based on the center sink location, wherein the final sink location is a connection for an output terminal point of a sector buffer that drives a clock signal to the loads of the cluster of loads.

7. The computer program product of claim 6 further comprising computer usable program code configured to:
use the center sink locations of each of the clusters of loads as initial sink locations;
balance the plurality of loads across the center sink locations based, at least in part, on magnitude of the loads and delays of paths between the loads and the center sink locations, wherein the computer usable program code configured to balance the plurality of loads across the center sink locations yields second clusters of loads from the plurality of loads;
for each cluster of the second clusters of loads,
determine a second center sink location that is at least approximately at a center of the cluster of the second cluster of loads;
wherein the computer usable program code configured to indicate the final sink location based on the center sink location comprises the computer usable program code configured to select the second center sink location as the final sink location for the cluster of the second clusters of loads.

8. The computer program product of claim 6, wherein the computer usable program code configured to determine the center sink location that is at least approximately at the center of the cluster of loads for each of the clusters of loads comprises the computer usable program code configured to select the center sink location from a plurality of candidate sink locations within the cluster of loads.

9. The computer program product of claim 8, wherein the computer usable program code configured to select the center sink location from a plurality of candidate sink locations within the cluster of loads comprises the computer usable program code configured to determine a minimum of one of a summation, maximum, or standard deviation of delays on the paths to the loads from each of the plurality of candidate sink locations.

10. The computer program product of claim 6, wherein the computer usable program code configured to determine the center sink location that is at least approximately at the center of the cluster of loads for each of the clusters of loads comprises the computer usable program code configured to determine a geometric center of the cluster.

* * * * *